United States Patent
Lewison et al.

(10) Patent No.: US 7,423,445 B2
(45) Date of Patent: Sep. 9, 2008

(54) METHOD AND SYSTEM FOR TRIMMING VOLTAGE OR CURRENT REFERENCES

(75) Inventors: Richard Lewison, Cary, NC (US); Vincent Acierno, Chapel Hill, NC (US); Klaus Hummler, Apex, NC (US)

(73) Assignee: Qimonda North America Corp., Cary, NC (US)

( * ) Notice: Subject to any disclaimer, the term of this patent is extended or adjusted under 35 U.S.C. 154(b) by 135 days.

(21) Appl. No.: 11/487,472

(22) Filed: Jul. 17, 2006

(65) Prior Publication Data

US 2008/0012596 A1 Jan. 17, 2008

(51) Int. Cl.
G01R 31/26 (2006.01)
G01R 31/28 (2006.01)
G01R 31/00 (2006.01)

(52) U.S. Cl. .................. 324/765; 324/763; 324/158.1; 324/771; 714/724

(58) Field of Classification Search ......... 324/754–771, 324/158.1; 714/724
See application file for complete search history.

(56) References Cited

U.S. PATENT DOCUMENTS

| | | | |
|---|---|---|---|
| 6,591,210 B1 * | 7/2003 | Lorenz | 702/99 |
| 6,720,800 B2 | 4/2004 | Shyr et al. | |
| 6,950,339 B2 | 9/2005 | Jeong et al. | |
| 7,000,160 B2 * | 2/2006 | Tanaka et al. | 714/724 |
| 7,277,350 B2 * | 10/2007 | Huckaby et al. | 365/226 |

* cited by examiner

Primary Examiner—Ha Nguyen
Assistant Examiner—Emily Y Chan
(74) Attorney, Agent, or Firm—Edell, Shapiro & Finnan, LLC

(57) ABSTRACT

Trim codes are determined for semiconductor devices under test (DUTs), wherein the trim codes correspond to voltage or current reference value adjustments that cause the DUTs to generate desired voltage or current reference values. The technique involves supplying respective trim codes simultaneously to the DUTs to cause them to generate trimmed analog voltage or current references, simultaneously feeding a test analog voltage or current reference having a preselected reference value to the DUTs, and for each DUT, comparing the value of the test analog reference to the values of the trimmed analog references to ascertain the crossing of the value of the test analog reference by the values of the trimmed references, whereby for each DUT the trim code corresponding to the value of the trimmed analog voltage or current reference immediately above or below the crossing is established as the preferred trim code to be used for that DUT.

10 Claims, 4 Drawing Sheets

METHOD AND SYSTEM FOR TRIMMING VOLTAGE OR CURRENT REFERENCES

FIELD OF THE INVENTION

The invention is directed to a method and system for trimming voltage or current references in semiconductor devices, and particularly to a method and system which reduces the time which it takes to trim such voltage or current references in a plurality of semiconductor devices.

BACKGROUND OF THE INVENTION

Semiconductor devices frequently have the ability to generate voltage or current references on chip. Such references are used during the operation of the chip, and sometimes other reference or current voltages are scaled from them.

While the voltage or current references generated by chips of the same nominal type are theoretically identical, in practice, because of process variations in the manufacturing of the chips, such voltage or current references provided by individual chips may be somewhat different. To correct the voltage or current references so that all chips generate the identical preselected voltage or current reference within some acceptable error, a trimming capability may be incorporated in the chips. A trim code may be stored in each chip which corresponds to the amount which the voltage or current reference generated by that chip needs to be adjusted in order to provide the preselected voltage or current reference. A particular semiconductor device which may have trimmable voltage or current reference generating capability is a dynamic random access memory (DRAM). While the present invention may be utilized in connection with providing trimmed voltage or current references for DRAMs, it is not so limited and may be used in connection with other semiconductor devices having trimmable voltage or current reference generating capability.

It is during the testing of the chips that the trim codes are established for the devices. In the prior art, a tester apparatus was provided, and each device under test (DUT) was individually fed by the tester with a sequence of trim codes for a particular reference. The trimmed voltage or current reference was fed back to the tester and compared with a preselected voltage or current reference value. By testing multiple iterations determined by the trim code sequencing, the preferred trim code was determined by the tester, and then it was necessary for the tester to reprogram the DUT with the preferred trim code in order to continue subsequent testing of the DUT. The testing of chips with the prior art methodology was time consuming because each DUT needed to be trimmed individually, and each DUT needed to be reprogrammed with the preferred trim code prior to further testing.

SUMMARY OF THE INVENTION

In accordance with the present invention, a method is provided which determines for each of a plurality of semiconductor devices under test (DUTs) which of a plurality of trim codes corresponding to voltage or current reference value adjustments is the preferred trim code to be used to cause the respective DUTs to provide voltage or current references having a preselected trimmed voltage or current value. The method involves generating and successively feeding respective trim codes simultaneously to the plurality of DUTs to cause them to generate trimmed analog voltage or current references, feeding a test analog voltage or current reference having a value corresponding to the preselected trimmed reference voltage or current value simultaneously to the plurality of DUTs, and for each DUT, comparing the value of the test analog voltage or current reference to the values of the trimmed analog voltage or current references to ascertain the crossing of the value of the test analog voltage or current reference by the values of the trimmed voltage or current references, whereby for each DUT the trim code corresponding to the value of the trimmed analog voltage or current reference immediately above or immediately below the crossing is established as the preferred trim code to be used for that DUT.

BRIEF DESCRIPTION OF THE DRAWINGS

The invention will be better appreciated by referring to the accompanying drawings wherein.

DETAILED DESCRIPTION

Figure 1:
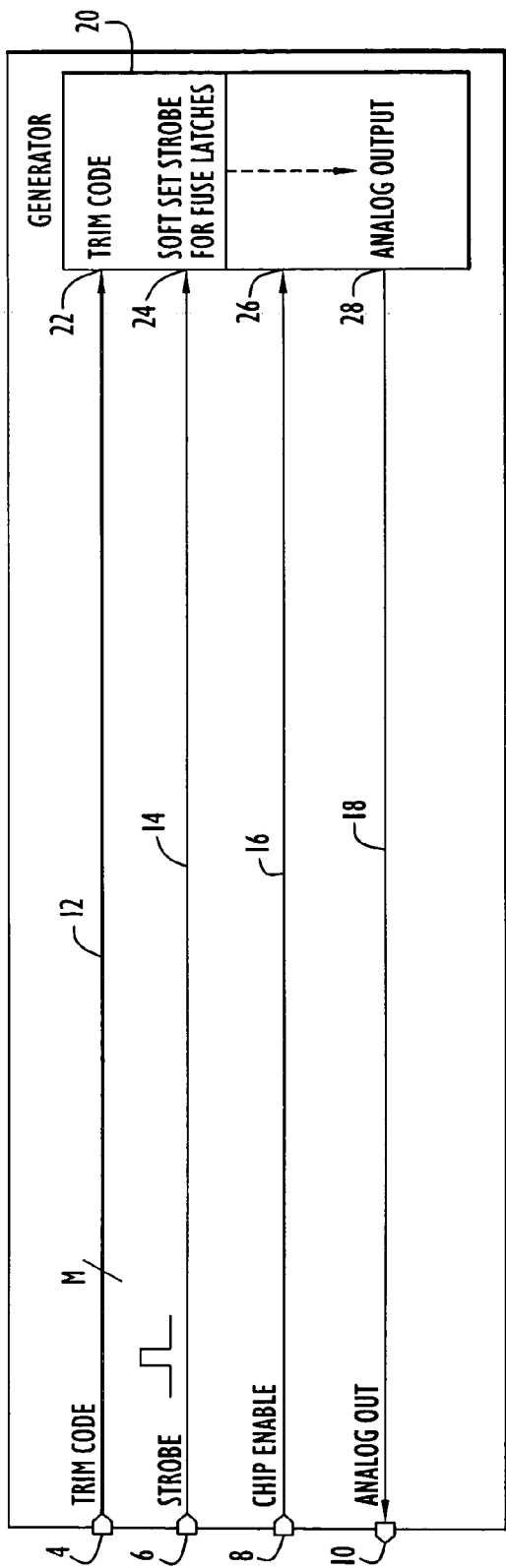
FIG. 1 shows a prior art apparatus for trimming voltage or current references in a device under test (DUT).

Referring to FIG. 1, an apparatus for trimming a voltage or current reference in a single device under test (DUT) is depicted. DUT 2 is shown, which includes generator 20 which is capable of converting digital trim codes to analog output values. Also shown are various input and output contacts including trim code input contact 4, strobe input contact 6 and chip enable input 8, as well as analog output contact 10. A sequence of trim codes is provided by a tester (not shown) to contact 4, each of which corresponds to a different analog voltage or current reference adjustment value. On the chip, the trim codes are fed on line 12 to input 22 of generator 20.

A strobe signal provided by the tester is applied to contact 6, which feeds line 14 and then input 24 of generator 20. The generator 20 is arranged so that on the leading or trailing edge of the strobe, the trim code is latched in as a soft set to the fuse latches of the DUT. When the preferred trim code is determined, it is permanently stored in the DUT by burning a set of fuses. However, for the purpose of testing the DUT, a set of latches called "fuse latches" are used, which circumvent the actual fuses for temporarily storing test trim codes in the DUT.

A chip enable signal is provided to input contact 8 of the DUT, which is fed on line 16 to input 26 of generator 20. The purpose of the chip enable signal is to render the chip transparent to the strobe signal so long as testing is to continue, i.e., until such time as the preferred trim code is identified. When a trim code is latched into the fuse latches, the generator 20 generates a corresponding analog output voltage or current at generator output 28 which communicates on line 18 to analog contact 10. The analog output has a value corresponding to the voltage or current reference inherently generated by the chip as modified by the latched trim code. This trimmed analog voltage or current reference is fed from output contact 10 back to the tester.

The tester has a preselected voltage or current reference value stored therein, and contains software for effecting a comparison between the stored value and the sequence of analog reference values presenting at output contact 10. When an equality, within a certain error is detected, the tester causes the chip enable line 16, which is fed through contact 8, to go low, thereby inhibiting further trim codes from being latched in.

Figure 2:
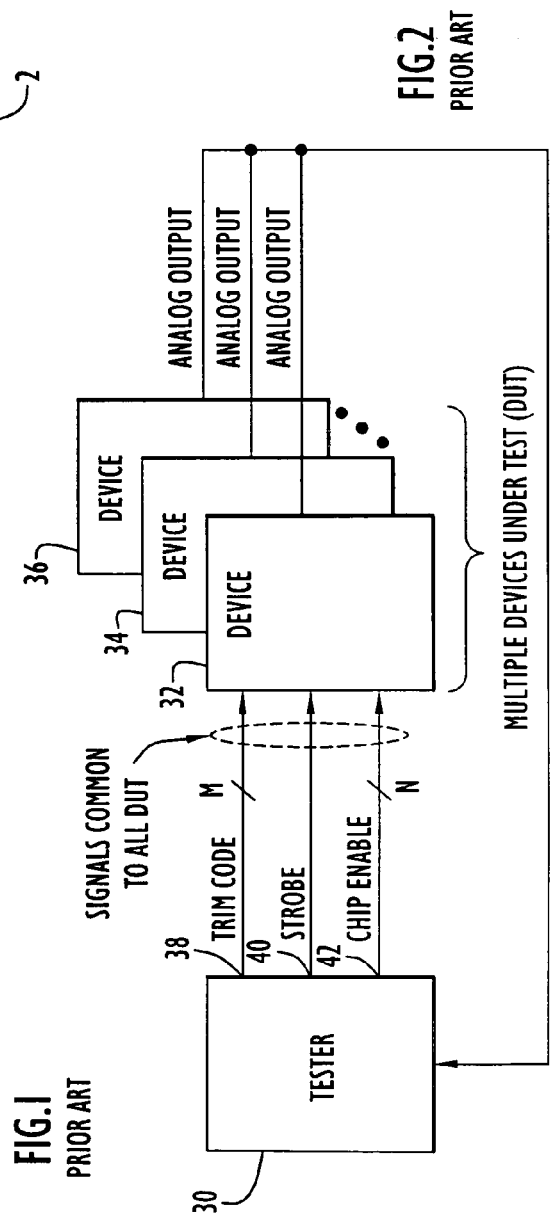
FIG. 2 shows a prior art system for trimming voltage or current references in a plurality of devices under test (DUTs).

FIG. 2 depicts a prior art system for testing a plurality of DUTs. Representative DUTs 32, 34, and 36 are shown, although the actual number of DUTs tested may be much larger. A tester 30, as described above in connection with FIG. 1 is shown. The tester has a trim code output 38, a strobe output 40, and a chip enable output 42. Each DUT has a generator similar to generator 20 shown in FIG. 1.

In the testing procedure, the signals are applied to DUT 32, and the analog output signal from DUT 32 is fed back and interpreted by the tester 30, then the signals are applied to DUT 34, the analog output signals for DUT 34 are fed back to the tester, and so forth for the other DUTs. The chip enable signal selects which DUT is being tested as it provides an active signal to only one DUT at a time. As can be seen, because of the individual testing of the DUTs, testing all DUTs is a time consuming process. In a known tester 40, the software which performs the comparison of the analog output values with the preselected reference value is at a premium because of cost considerations, and cannot economically handle the comparisons which would be required by a plurality of DUTs simultaneously.

Figure 3:
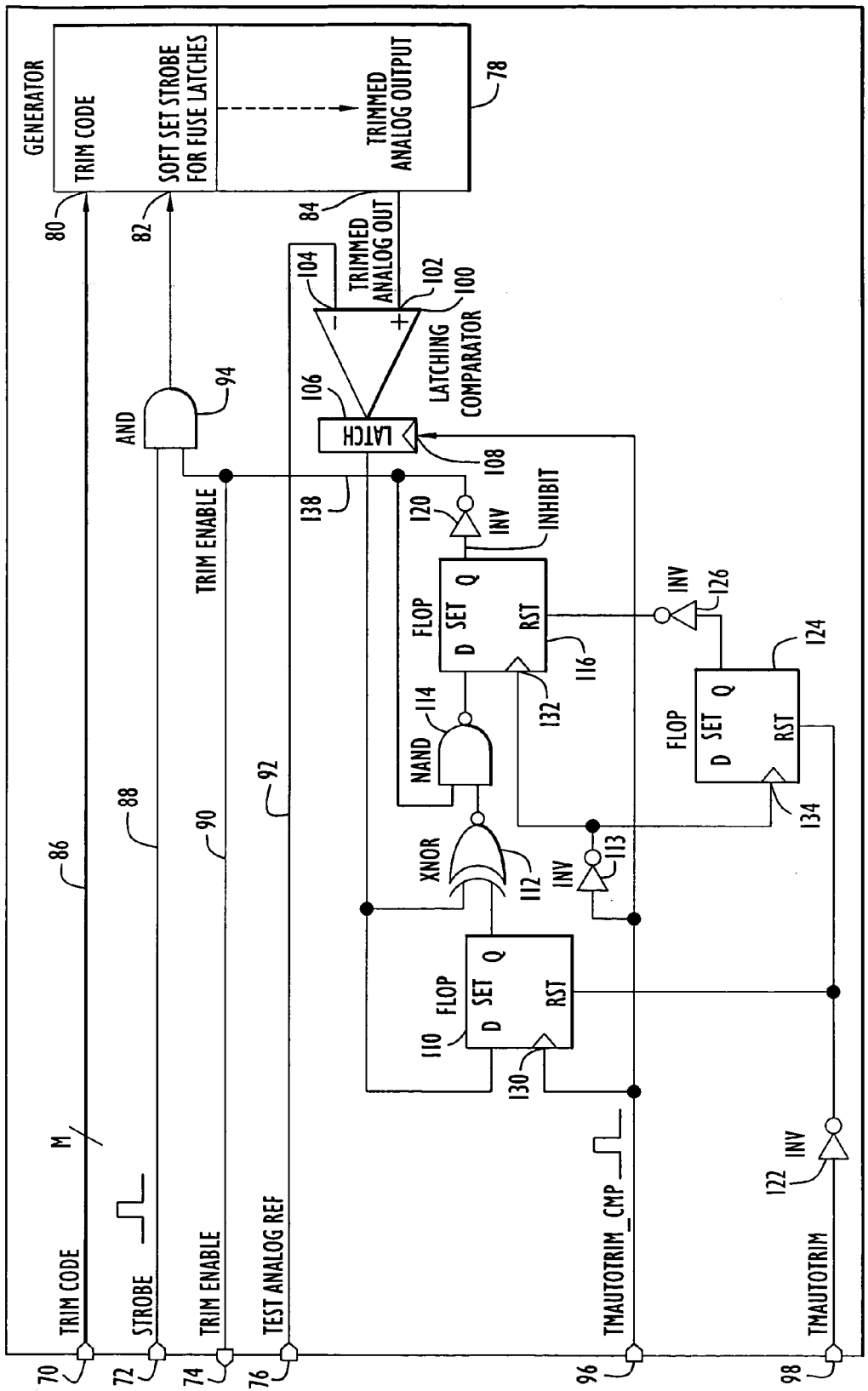
FIG. 3 is a block diagram of an embodiment of an apparatus in accordance with the invention for trimming voltage or current references in a device under test (DUT).

FIG. 3 is a block diagram of an embodiment of an apparatus in accordance with the invention for testing a single DUT. All of the components shown in FIG. 3 may be incorporated in the chip itself. At the left side of the diagram, input contacts including trim code input contact 70, strobe input contact 72, test analog ref input contact 76, tmautotrim_cmp contact 96, and tmautotrim input contact 98 are shown. Trim enable output contact 74 is also shown. At the upper right side of the diagram, generator 78 is shown, which is similar to generator 20 of FIG. 1.

The trim code signals which are generated by the tester (not shown) are fed to trim code input contact 70, and are communicated on line 86 to trim code input 80 of generator 78. The strobe signal is fed from the tester to strobe input contact 72, and is communicated on line 88 to one input of AND gate 94. The trim enable signal from inverter 120 is fed to the other input of AND gate 94. The output of AND gate 94 is fed to soft set strobe input 82 of generator 78. As long as the trim enable signal is high, as it will be as long as the preferred trim code has not yet been identified and more trim codes are to be evaluated, the AND gate 94 is transparent to the latch signal. If tmautotrim is inactive (0), then the AND gate will also be transparent. As described in connection with FIG. 1, on the leading or trailing edge of the strobe, the trim code is latched into the DUT fuse latches as a soft set. Generator 78 then generates an analog output having a value corresponding to the inherent voltage or current reference value provided by the chip as adjusted by the operative trim code, i.e., the trimmed analog voltage or current reference.

The embodiment of FIG. 3 is also provided with comparator 100 for comparing the trimmed analog voltage or current reference with a preselected test analog reference provided by the tester. It also includes logic circuitry for deciding when the value of the test analog reference has been crossed by the value of the trimmed analog reference, for retaining the trim code which caused such crossing, and for inhibiting the latching of further trim codes.

The test analog reference is fed from the tester to test analog ref input contact 76, and is communicated on line 92 to input 104 of comparator 100. The trimmed analog reference is fed from trimmed analog out output 84 of generator 78 to input 102 of comparator 100. The comparator 100 may include latch 106.

Figure 4:
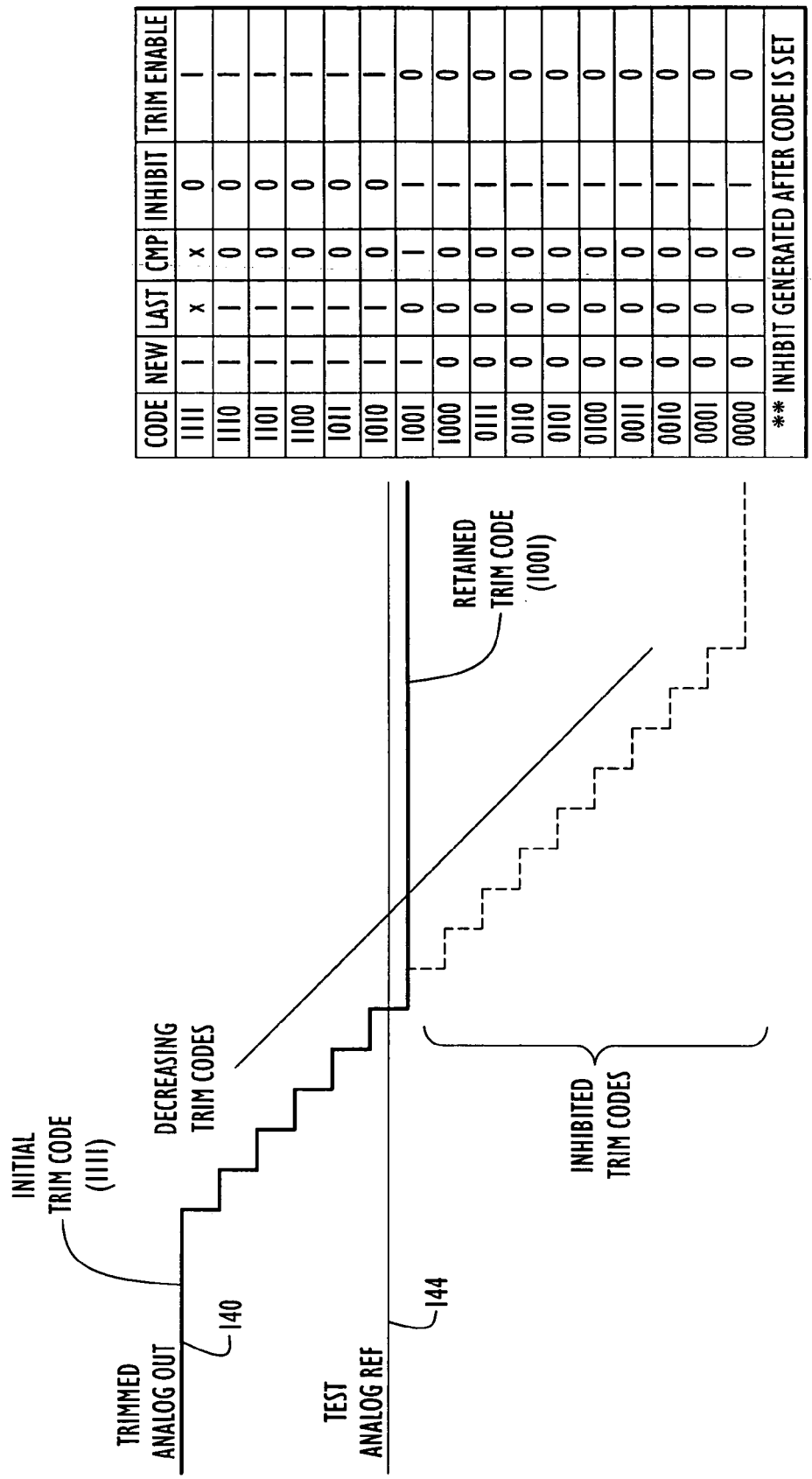
FIG. 4 is a representation depicting a test analog reference value being crossed by a sequence of analog trim code reference values and also contains an associated table which denotes the states of various signals in the block diagram of FIG. 3.

Referring to FIG. 4, the levels of the two inputs to the comparator, trimmed analog out and test analog ref are superimposed over each other. It should be noted that the trimmed analog out signal is monotonically stepwise increasing or decreasing. By way of non-limitative example, in an actual embodiment where the DUTs were DRAMs, the preselected voltage reference (test analog ref) was 1.2 volts and each step of the trimmed analog out reference voltage was 30 millivolts. The comparator 100 detects the crossing of the test reference by the trimmed reference, and the trim code which is identified as the preferred trim code corresponds to either the level immediately above the crossing, which is the case when the incremental steps are ascending, or the level immediately below the crossing, which is the case when the incremental steps are descending. Thus, in the above example, the average error would be 15 millivolts (±½ step size).

Referring again to FIG. 3, the tmautotrim_cmp signal is inputted at contact 96, and is fed to the input 108 of latch 106, so when this signal goes high it latches in the result of the comparator 100 as against the prior value. As long as there is no crossing of the value of the test analog reference by the value of the trimmed analog reference signal, the output of latch 106 is low, the Q output of flip-flop 110 is low, and the output of exclusive NOR gate 112 is high. The Inhibit signal, at the output of flip-flop 116 stays low until there is a crossing and the output of latch 106 goes high, causing the output of exclusive NOR gate 112 to go low. This signal is fed through NAND gate 114 to flip-flop 116 and causes the Q output of flip-flop 116 (the Inhibit signal) to go high. Inverter 120 causes the trim enable signal to go low, which causes the output of AND gate 94 to go low, thus stopping the latching of further trim codes by generator 78. It is noted that the tmautotrim_cmp signal is also fed to the clock input 130 of flip-flop 110 and to inverter 113, which is connected to the clock input 132 of flip-flop 116, thus ensuring that the Inhibit signal occurs at a time after the occurrence of the crossing of the test analog reference by the trimmed analog reference. If it is desired to again determine a preferred trim code, the logic must be reset. This is accomplished by the tmautotrim signal which is inputted from the tester at input contact 98. Since this signal acts through inverter 122, when it goes low, it resets flip flops 110 and 124. The resetting of flip-flop 124 acting through inverter 126, and is effective to reset flip-flop 116. It is to be understood that the specific logic circuitry disclosed herein is exemplary and that other specific circuitry may accomplish the same functions. It is also intended that terms such as "exclusive OR type gate", "AND type gate", etc. be construed as covering both exclusive OR gates and exclusive NOR gates or both AND gates and NAND gates respectively.

Referring again to FIG. 4, in the example depicted, the trim codes are generated in order of decreasing value. Thus, the trim code which is operative immediately after the crossing is selected as the preferred trim code (1001 in the example), and all trim codes which would have been operative thereafter are inhibited. The preferred trim code 1001 is retained. Referring to the associated chart in FIG. 4, it is seen that the comparator output (CMP) is "1" only at trim code 1001, that all trim codes beginning at 1001 (after the code is set) and lower are inhibited, and that the trim enable signal is zero for such trim codes.

At the tmautotrim_cmp that followed the soft setting of code 1010, the generator output voltage had not yet crossed the test analog ref input, so the inhibit signal was still low (0). The next soft set of Code 1001 caused a crossing but was not recognized until tmautotrim_cmp was issued.

Figure 5:
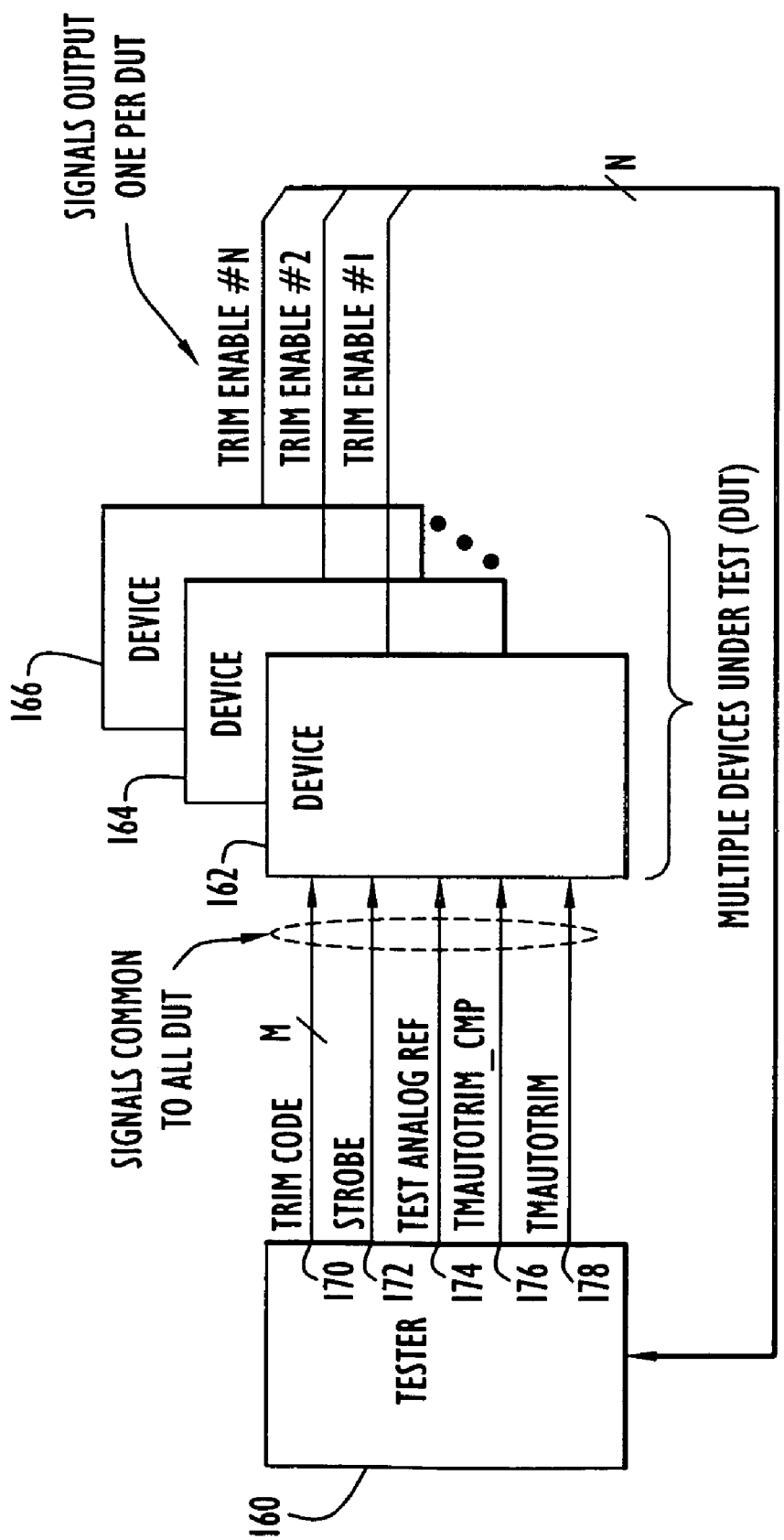
FIG. 5 shows a system in accordance with an embodiment of the invention for trimming voltage or current references in a plurality of devices under test (DUTs).

FIG. 5 shows a system in accordance with an embodiment of the invention for testing a plurality of DUTs. Unlike in the prior art where each DUT must be individually tested to ascertain the preferred trim code, in the embodiment of FIG. 5, all DUTs are tested and trimmed in parallel, thus resulting in a substantial savings in time. In the embodiment of FIG. 5, there is a comparator and associated logic similar to what is depicted in FIG. 3 associated with each DUT. While in the example of FIG. 3 the comparator is incorporated in the chip which comprises the DUT, more generally, the comparators and logic can reside on the chip, in the tester, or on the tester peripheral circuit board.

Referring to FIG. 5, tester 160 has outputs corresponding to the inputs on the chip which is depicted in FIG. 3, namely trim code output 170, strobe output 172, analog ref output 174, tmautotrim_cmp output 176, and tmautotrim output 178. These outputs are fed to all DUTs simultaneously in parallel manner, either through common lines as depicted in FIG. 5 or through multiple lines from the tester, so that in operation respective, successive trim codes are inputted to all DUTs at the same time. Representative DUTs 162, 164, and 166 are shown. The determination of the preferred trim code for each DUT proceeds as discussed in connection with FIG. 3, as does the storage of the preferred trim codes in the devices. There is also a trim enable line connected from each DUT to the tester. As will be noted in connection with the chart of FIG. 4, from the state of the trim enable lines, the identity of the retained trim code may be determined. The tester simultaneously monitors all trim enable lines and stores the identity of the retained trim code for each DUT at a later time offline. This information will (in the example of DRAMS) be used to determine fuse burning associated with the respective generator. By providing a comparator for each DUT, the DUT's may be tested in parallel, while the trim enable information for all DUTs is readily processed by the tester.

Methods, systems and devices for trimming voltage or current references have thus been described. While the invention has been described in connection with preferred embodiments, it should be noted that the systems and methods and devices described herein may be embodied in other specific forms without departing from the spirit or essential characteristics thereof. Thus, the foregoing embodiments are to be considered in all respects illustrative and not meant to be limiting.

What is claimed is:

1. A system for determining for each of a plurality of semiconductor devices under test (DUTs) which of a plurality of trim codes corresponding to voltage or current reference value adjustments is the preferred trim code to be used to cause the respective DUTs to provide voltage or current references having a preselected trimmed voltage or current value, comprising:

a tester having a plurality of output lines in parallel configuration for feeding respective trim codes generated by the tester simultaneously to said plurality of DUTs to cause them to generate trimmed analog voltage or current references wherein the trim codes are capable of corresponding selectively either to references of progressively increasing magnitude or to references of progressively decreasing magnitude, and also having a plurality of output lines in parallel configuration for feeding a test analog voltage or current reference generated by the tester having a value corresponding to said preselected trimmed voltage or current value simultaneously to said plurality of DUTs;

a comparator for each DUT which compares the value of said test analog voltage or current reference to the values of said trimmed analog voltage or current references to ascertain the crossing of the value of said test analog reference voltage or current reference by the values of said trimmed voltage or current references; and decision logic which establishes for each DUT the preferred trim code to be used for that DUT, which is the trim code corresponding to the value of the trimmed analog voltage or current reference immediately above the crossing in the case where the trim codes correspond to references of progressively increasing magnitude and to the reference immediately below the crossing in the case where the trim codes correspond to references of progressively decreasing magnitude.

2. The system of claim 1 wherein said comparator for each DUT is physically incorporated in that DUT.

3. The system of claim 2 wherein the preferred trim code established for each DUT is stored in that DUT.

4. The system of claim 1 further comprising a conductor between each DUT and the tester for simultaneously obtaining at the tester the preferred trim code established for each DUT.

5. The system of claim 4 wherein the comparator includes a latch.

6. A system for determining for each of a plurality of semiconductor devices under test (DUTs) which of a plurality of trim codes corresponding to voltage or current reference value adjustments is the preferred trim code to be used to cause the respective DUTs to provide voltage or current references having a preselected trimmed voltage or current value, comprising:

means for generating and successively feeding respective trim codes simultaneously to said plurality of DUTs to cause them to generate trimmed voltage or current references wherein the trim codes are capable of corresponding selectively either to references of progressively increasing magnitude or to references of progressively decreasing magnitude;

means for feeding a test analog voltage or current reference having a value corresponding to said preselected trimmed reference voltage or current value simultaneously to said plurality of DUTs;

means for comparing for each DUT the value of said test analog voltage or current reference to the values of said trimmed voltage or current references to ascertain the crossing of the value of said test analog voltage or current reference by the values of said trimmed voltage or current references; and means for establishing for each DUT the preferred trim code to be used for that DUT, which is the trim code corresponding to the value of the trimmed analog voltage or current reference immediately above the crossing in the case where the trim codes correspond to references of progressively increasing magnitude and to the reference immediately below the crossing in the case where the trim codes correspond to references of progressively decreasing magnitude.

7. The system of claim 6 wherein said means for comparing and said means for establishing are physically incorporated in the respective DUTs.

8. The system of claim 7 further comprising means for storing the trim code established for each DUT.

9. The system of claim 6 further comprising means for accessing said plurality of DUTs simultaneously to obtain the trim code established for each DUT.

10. The system of claim 9 further comprising means for inhibiting the latching of trim codes by the DUTs after the preferred trim code is established.

* * * * *